United States Patent
Sugiura

(10) Patent No.: US 9,917,573 B2
(45) Date of Patent: Mar. 13, 2018

(54) VOLTAGE DETECTION CIRCUIT

(71) Applicant: Seiko Instruments Inc., Chiba-shi, Chiba (JP)

(72) Inventor: Masakazu Sugiura, Chiba (JO)

(73) Assignee: SII SEMICONDUCTOR CORPORATION, Chiba (JP)

( * ) Notice: Subject to any disclaimer, the term of this patent is extended or adjusted under 35 U.S.C. 154(b) by 0 days.

(21) Appl. No.: 14/956,900

(22) Filed: Dec. 2, 2015

(65) Prior Publication Data
US 2016/0161532 A1  Jun. 9, 2016

(30) Foreign Application Priority Data
Dec. 9, 2014 (JP) ................. 2014-249103

(51) Int. Cl.
*H03L 7/00* (2006.01)
*H03K 5/24* (2006.01)
*G01R 19/00* (2006.01)

(52) U.S. Cl.
CPC .......... *H03K 5/24* (2013.01); *G01R 19/0084* (2013.01); *H03K 5/2472* (2013.01)

(58) Field of Classification Search
CPC .......... H02H 1/0007; H02H 3/08; G05F 1/56; H02M 3/156
USPC .... 327/108–112, 427, 434, 437, 78; 326/82, 326/83, 87; 323/283
See application file for complete search history.

(56) References Cited

U.S. PATENT DOCUMENTS

| | | | | |
|---|---|---|---|---|
| 6,157,579 A * | 12/2000 | Micheloni | ............... | G11C 7/20 365/189.07 |
| 6,304,148 B1 * | 10/2001 | Nomura | .................. | G11C 7/04 326/95 |
| 6,683,481 B1 * | 1/2004 | Zhou | .................... | H03K 17/223 327/143 |
| 2009/0091393 A1 * | 4/2009 | Quan | ..................... | H03L 7/107 330/288 |
| 2010/0231280 A1 * | 9/2010 | Lee | ........................ | H03H 11/26 327/262 |
| 2014/0167824 A1 * | 6/2014 | Nakamoto | ............. | H03M 1/12 327/143 |

FOREIGN PATENT DOCUMENTS

JP  11-135732 A  5/1999

* cited by examiner

*Primary Examiner* — Thomas Skibinski
(74) *Attorney, Agent, or Firm* — Brinks Gilson & Lione

(57) ABSTRACT

To provide a voltage detection circuit which avoids unintentional on/off-control of an output transistor immediately after starting a power supply. A voltage detection circuit is configured to be equipped with a comparator which compares a detected voltage and a reference voltage, and an inverter which drives an output transistor, based on an output of the comparator and to supply the operating current of the inverter by a current source.

4 Claims, 4 Drawing Sheets

VOLTAGE DETECTION CIRCUIT

RELATED APPLICATIONS

This application claims priority under 35 U.S.C. § 119 to Japanese Patent Application No. 2014-249103 filed on Dec. 9, 2014, the entire content of which is hereby incorporated by reference.

BACKGROUND OF THE INVENTION

Field of the Invention

The present invention relates to a voltage detection circuit which detects a predetermined voltage.

Background Art

A related art voltage detection circuit is illustrated in FIG. 4. The related art voltage detection circuit is equipped with a voltage input terminal 401 inputted with a detected voltage VSIG, a voltage output terminal 407, resistors 402 and 403 which divide and output the detected voltage VSIG, a reference voltage circuit 404 which outputs a reference voltage VREF, a comparison functioning unit 410 equipped with a comparator 405 which compares a voltage based on the detected voltage VSIG and the reference voltage VREF, and an output transistor 406 on/off-controlled by the comparison functioning unit 410.

A drain terminal of the output transistor 406 is connected to the voltage output terminal 407. The voltage output terminal 407 is pulled up to an external voltage by an unillustrated pull-up resistor.

The output transistor 406 is on/off-controlled based on the relationship of magnitude between the detected voltage VSIG and the reference voltage VREF to output a voltage based on a negative power supply voltage VSS or an external voltage.

[Patent Document 1] Japanese Patent Application Laid-Open No. Hei 11(1999)-135732, FIG. 8

SUMMARY OF THE INVENTION

The related art voltage detection circuit illustrated in FIG. 4 is however accompanied by a problem that the output transistor 406 is on/off-controlled unintentionally at power-on so that the output voltage from the voltage output terminal 407 becomes unstable.

The comparator 405 is operated by an unillustrated positive power supply voltage VDD. When the power supply voltage VDD does not reach the operating voltage of the comparator 405 at power-on, the output of the comparator 405 becomes unstable. Therefore, the output transistor 406 is on/off-controlled unintentionally, thus resulting in that the output voltage from the voltage output terminal 407 becomes unstable.

At power-on, the detection voltage is not preferably outputted to the voltage output terminal 407 to prevent various devices operated in response to the voltage of the voltage output terminal 407 from malfunctioning.

The present invention has been made to solve the above-described problems and is intended to provide a voltage detection circuit stable in output voltage even at power-on.

In order to solve the related art problems, the voltage detection circuit of the present invention is configured as follows:

The voltage detection circuit is configured to be equipped with a comparator which compares a detected voltage and a reference voltage, and an inverter which drives an output transistor, based on the output of the comparator and to supply the operating current of the inverter by a current source.

With the above configuration, the output of the inverter is fixed to a positive power supply voltage VDD or a negative power supply voltage VSS regardless of the output of the comparator during a predetermined period at power-on, so that the voltage of a voltage output terminal becomes constant.

According to the voltage detection circuit of the present invention, there can be provided a voltage detection circuit which avoids unintentional on/off-control of an output transistor at power-on.

DETAILED DESCRIPTION OF THE PREFERRED EMBODIMENTS

Voltage detection circuits according to the present embodiment will hereinafter be described with reference to the accompanying drawings.

Figure 1:
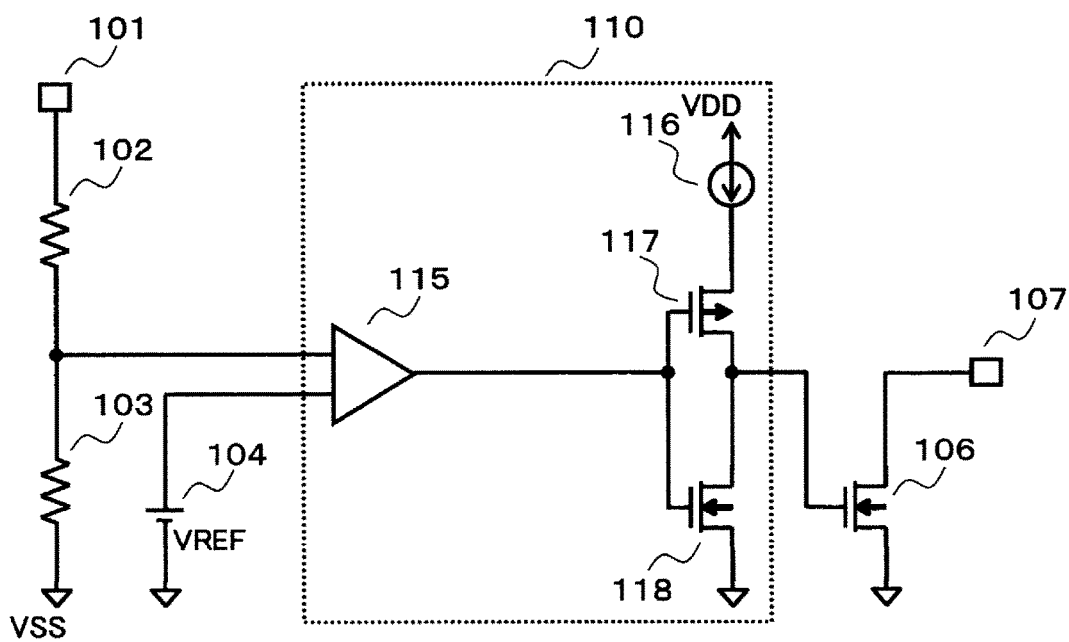
FIG. 1 is a circuit diagram illustrating a voltage detection circuit according to the present embodiment.

FIG. 1 is a circuit diagram illustrating a voltage detection circuit according to the present embodiment. The voltage detection circuit is equipped with a voltage input terminal 101 inputted with a detected voltage VSIG, a voltage output terminal 107, resistors 102 and 103 which divide and output the detected voltage VSIG, a reference voltage circuit 104 which outputs a reference voltage VREF, a comparison functioning unit 110 which compares a voltage based on the detected voltage VSIG and the reference voltage VREF, and an output transistor 106 on/off-controlled by the comparison functioning unit 110. The comparison functioning unit 110 is equipped with a comparator 115, transistors 117 and 118 which configure an inverter controlled by the output of the comparator 115, and a current source 116 which supplies the operating current of the inverter. The voltage output terminal 107 is connected to a drain terminal of the output transistor 106 and pulled up to an external voltage by an unillustrated pull-up resistor, for example.

Next, the operation of the voltage detection circuit according to the present embodiment will be described. Although the voltage detection circuit is identical in basic operation to the related art voltage detection circuit, a difference from the related art voltage detection circuit resides in the operation of the comparison functioning unit 110. When, for example, the comparison functioning unit 110 detects that the detected voltage VSIG becomes higher than a predetermined voltage, the comparator 115 outputs an L level. That is, the voltage detection circuit outputs a detection signal of an L level to the voltage output terminal 107.

In the comparison functioning unit 110 of the voltage detection circuit according to the present embodiment, the comparator 115 on/off-controls the inverter comprised of the transistors 117 and 118, based on the relationship of magnitude between the detected voltage VSIG and the reference voltage VREF. When the inverter on-controls the output transistor 106, the gate capacitance of the output transistor 106 is charged based on the current of the current source 116.

At power-on, the output of the comparator 115 becomes unstable when the power supply voltage VDD is temporarily less than the operating voltage of the comparator 115 at power-on, and the inverter is operated by the current source 116 when the comparator 115 outputs the L level. A gate voltage of the output transistor 106 does not therefore indicate an H level immediately. This is because the gate capacitance of the output transistor 106 is charged by the current of the current source 116. That is, even if the output of the comparator 115 becomes unstable, the voltage detection circuit does not output the detection signal of the L level to the voltage output terminal 107.

With the voltage detection circuit described above, there can be provided a voltage detection circuit which avoids unintentional on/off-control of an output transistor at power-on.

The current source 116 can be realized as an autonomous current source by using, for example, a depletion transistor whose gate and source terminals are short-circuited. Further, the current source 116 can be realized using a current mirror circuit.

Figure 2:
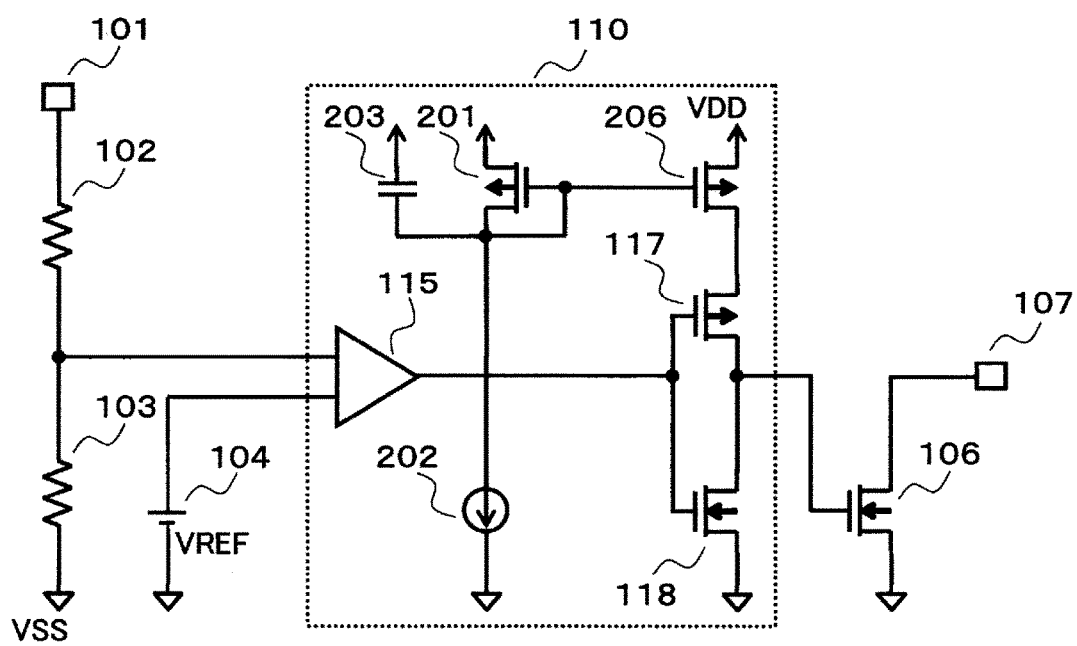
FIG. 2 is a circuit diagram illustrating a voltage detection circuit according to the present embodiment.

FIG. 2 is one example of a voltage detection circuit realized using the current mirror circuit as the current source 116. The current source 116 is equipped with a current source 202, a capacitor 203, a transistor 201, and a transistor 206. The transistor 206 configures a current mirror with the transistor 201 and allows a current based on a current of the current source 202 to flow.

At power-on, the current source 202 gently starts the current mirror circuit while charging an input capacitance including the capacitor 203 of the current mirror circuit configured by the transistors 201 and 206. A current value, i.e., driving capability capable of being supplied by the transistor 206 becomes gently high.

Since a more reduction in the current value for charging a gate capacitance of the output transistor 106 makes the output transistor 106 harder to turn on at power-on, the output transistor 106 is not turned on unintentionally.

With the voltage detection circuit of FIG. 2 as described above, there can be provided a voltage detection circuit which avoids unintentional on/off-control of an output transistor at power-on.

When the input capacitance of the current mirror circuit is sufficiently large, it is not necessary to intentionally provide the capacitor 203.

Figure 3:
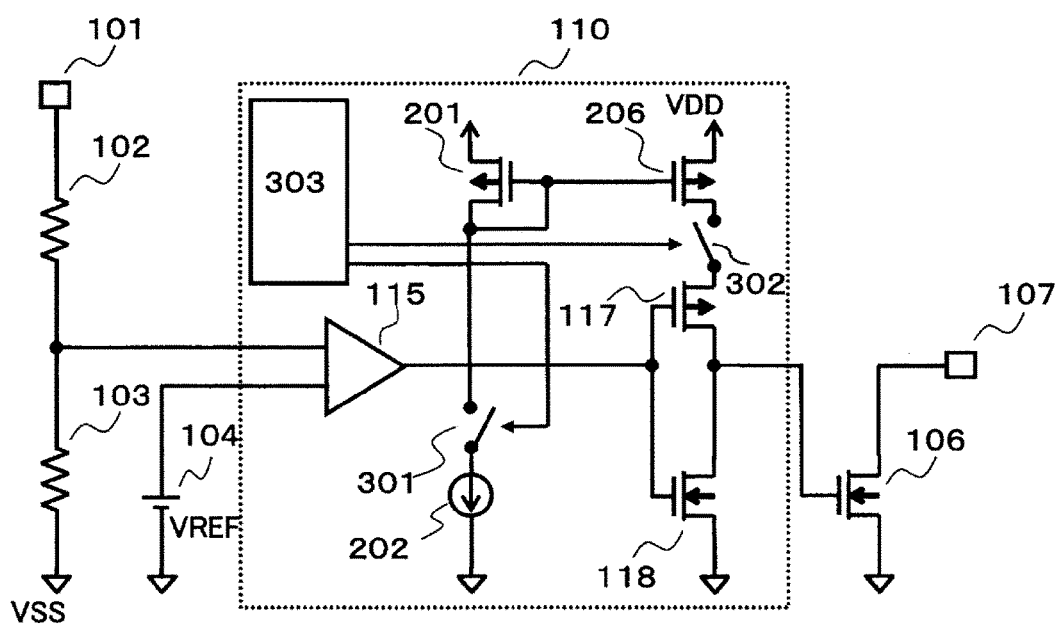
FIG. 3 is a circuit diagram illustrating a voltage detection circuit according to the present embodiment.
Figure 4:
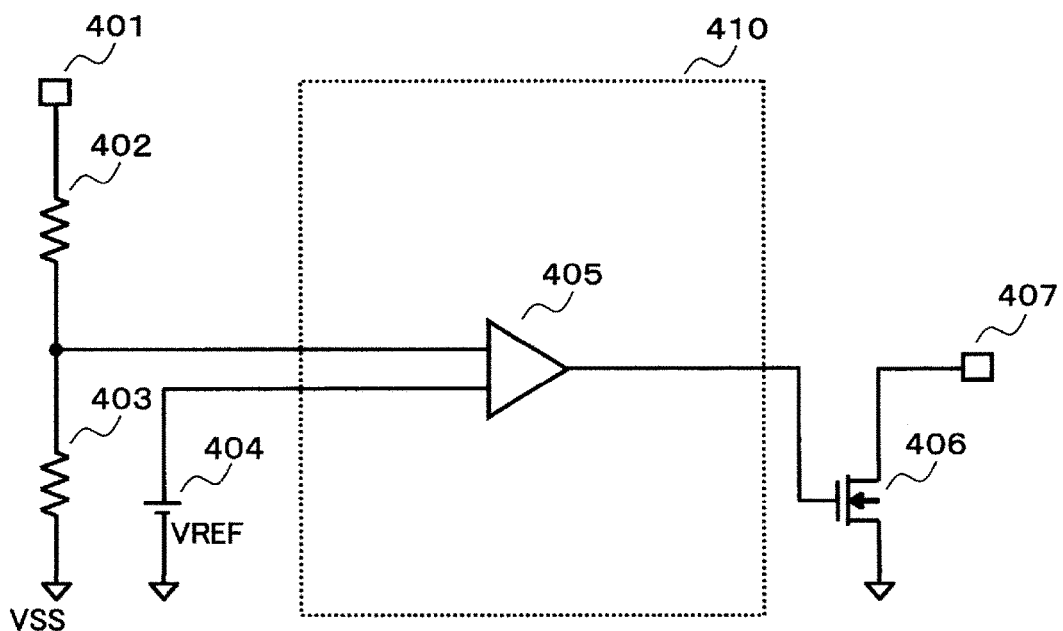
FIG. 4 is a circuit diagram illustrating a related art voltage detection circuit.

FIG. 3 illustrates a voltage detection circuit according to another embodiment as a method of gently improving a current value or driving capability capable of being supplied by a transistor 206 provided in place of the current source 116. A difference from FIG. 2 resides in that the capacitor 203 is omitted and switches 301 and 302 are newly provided. The switches 301 and 302 are off-controlled while a power supply voltage VDD at power-on is still low or a while after power-on, based on an output from a low power supply voltage detection circuit or a startup voltage detection circuit 303 which outputs a one-shot pulse at the power startup.

When the power supply voltage VDD exceeds the operating voltage of a comparator 115, the startup voltage detection circuit 303 turns on the switches 301 and 302. It is apparent that current cannot be supplied to an inverter so long as even only both or either of the switches 301 and 302 is turned off. Since the time is required to charge the gate capacitance of an output transistor 106 if the operating current of the inverter is small, the output transistor 106 is hard to be on-controlled.

With the voltage detection circuit of FIG. 3 as described above, there can be provided a voltage detection circuit which avoids unintentional on-control of an output transistor immediately after starting a power supply.

The voltage detection circuit may be configured to be equipped with a switch for short-circuiting between a gate and source of a transistor 201 in place of the switches 301 and 302 and on-control the switch at the startup of the power supply.

Incidentally, the voltage detection circuit is not limited to the embodiments illustrated in FIGS. 1, 2, and 3 insofar as means capable of suppressing the operating current of the inverter is concerned.

What is claimed is:

1. A voltage detection circuit which detects an input voltage, comprising:
   a set of division resistors which outputs a divided voltage proportional to the input voltage;
   a reference voltage circuit which generates a reference voltage;
   a comparator which compares the divided voltage and the reference voltage and outputs a detection signal at an output terminal of the comparator when the divided voltage is higher than the reference voltage;
   an output transistor responsive to the detection signal from the comparator to turn on to output a voltage detection signal, wherein the output transistor is not directly connected to the comparator;
   an inverter having an input terminal coupled directly to the output terminal of the comparator and an output terminal coupled directly to a gate of the output transistor, the inverter being operable to supply an inverted detection signal from its output terminal to the gate of the output transistor in response to reception, at its input terminal, of the detection signal from the comparator; and
   a current source configured to supply a limited current to drive the inverter so that the inverter outputs the inverted detection signal with the limited current from the current source to the gate of the output transistor, wherein the limited current is of an operation level predetermined to take a first time period to charge a capacitance of the gate of the output transistor, during the first time period, the output transistor being made non-responsive to a signal supplied to the gate thereof, and the first time period is set longer than a second time period taken by the comparator to become stably operational after the voltage circuit is turned on.

2. The voltage detection circuit according to claim 1, further comprising a current mirror circuit having an input terminal configured to receive the limited current from the current source and an output terminal configured to supply the limited current to drive the inverter.

3. The voltage detection circuit according to claim 2, wherein a capacitor is connected to the input terminal of the current mirror circuit and operable to cause the limited current being supplied from the output terminal of the current mirror circuit to delay in reaching the operation level of the limited current.

4. The voltage detection circuit according to claim 1, wherein the current source has a switch, and wherein when a power supply voltage is not greater than a predetermined voltage, the switch is turned off to stop the supply of a current by the current source.

\* \* \* \* \*